(12) United States Patent
Choi et al.

(10) Patent No.: US 10,269,629 B2
(45) Date of Patent: Apr. 23, 2019

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Junghun Choi, Seoul (KR); Jeong Ik Kim, Seongnam-si (KR); Myung Yang, Seoul (KR); Chul Sung Kim, Seongnam-si (KR); Sang Jin Hyun, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/624,783

(22) Filed: Jun. 16, 2017

(65) Prior Publication Data

US 2018/0068889 A1    Mar. 8, 2018

(30) Foreign Application Priority Data

Sep. 5, 2016    (KR) ........................ 10-2016-0114022

(51) Int. Cl.
*H01L 21/768*    (2006.01)
*H01L 23/528*    (2006.01)
(Continued)

(52) U.S. Cl.
CPC .. *H01L 21/76862* (2013.01); *H01L 21/76805* (2013.01); *H01L 21/76816* (2013.01); *H01L 21/76843* (2013.01); *H01L 21/76876* (2013.01); *H01L 21/76895* (2013.01); *H01L 23/485* (2013.01); *H01L 23/528* (2013.01);

*H01L 23/535* (2013.01); *H01L 23/53209* (2013.01); *H01L 23/53223* (2013.01);
(Continued)

(58) Field of Classification Search
CPC ............. H01L 21/76862; H01L 23/528; H01L 23/535; H01L 21/76895; H01L 21/76816; H01L 21/76843; H01L 21/76876; H01L 21/76805
See application file for complete search history.

(56) References Cited

U.S. PATENT DOCUMENTS 6,028,000 A    2/2000 Cho
2006/0270228 A1    11/2006 Lee et al.
(Continued)

FOREIGN PATENT DOCUMENTS

JP    06-29244 A    2/1994
JP    2001345325    * 12/2001
(Continued)

*Primary Examiner* — A. Sefer
(74) *Attorney, Agent, or Firm* — Lee & Morse, P.C.

(57) ABSTRACT

A semiconductor device and a method of manufacturing the same, the semiconductor device including a substrate; an insulating layer on the substrate, the insulating layer including a first trench and a second trench therein, the second trench having an aspect ratio that is smaller than an aspect ratio of the first trench; a barrier layer in the first trench and the second trench; a seed layer on the barrier layer in the first trench and the second trench; a first bulk layer on the seed layer and filled in the first trench; and a second bulk layer on the seed layer and filled in the second trench, wherein an average grain size of the second bulk layer is larger than an average grain size of the first bulk layer.

20 Claims, 22 Drawing Sheets

(51) Int. Cl.
*H01L 23/535* (2006.01)
*H01L 23/485* (2006.01)
*H01L 23/532* (2006.01)

(52) U.S. Cl.
CPC .. *H01L 23/53238* (2013.01); *H01L 23/53252* (2013.01); *H01L 23/53266* (2013.01)

(56) References Cited

U.S. PATENT DOCUMENTS

| | | | |
|---|---|---|---|
| 2009/0174075 A1* | 7/2009 | Yang | H01L 23/5226 257/751 |
| 2010/0068881 A1 | 3/2010 | Kang et al. | |
| 2010/0267235 A1 | 10/2010 | Chen et al. | |
| 2011/0062587 A1* | 3/2011 | Yang | H01L 21/76846 257/751 |
| 2012/0015518 A1 | 1/2012 | Chandrashekar et al. | |
| 2012/0193792 A1* | 8/2012 | Kim | H01L 21/0337 257/741 |
| 2013/0113101 A1* | 5/2013 | Cheng | H01L 21/76804 257/751 |
| 2013/0189839 A1 | 7/2013 | Guillorn et al. | |
| 2014/0030889 A1 | 1/2014 | Chen et al. | |
| 2015/0024592 A1 | 1/2015 | Chandrashekar et al. | |
| 2016/0240630 A1* | 8/2016 | Seong | H01L 29/66545 |

FOREIGN PATENT DOCUMENTS

| | | |
|---|---|---|
| JP | 2005-129831 A | 5/2005 |
| KR | 10-2000-0000882 A | 1/2000 |
| KR | 10-2001-0058538 A | 7/2001 |
| KR | 10-2001-0096408 A | 11/2001 |
| KR | 10-2002-0051155 A | 6/2002 |
| KR | 10-2003-0050062 A | 6/2003 |

* cited by examiner

SEMICONDUCTOR DEVICE AND METHOD OF MANUFACTURING THE SAME

CROSS-REFERENCE TO RELATED APPLICATION

Korean Patent Application No. 10-2016-0114022, filed on Sep. 5, 2016, in the Korean Intellectual Property Office, and entitled: "Semiconductor Device and Method of Manufacturing the Same," is incorporated by reference herein in its entirety.

BACKGROUND

1. Field

Embodiments relate to a semiconductor device and a method of manufacturing the same.

2. Description of the Related Art

A semiconductor device has characteristics, such as a small size, a multi-function, and/or low manufacturing cost, so that the semiconductor device may be used in many electronic industries. The semiconductor device may include a memory device storing data, a logic device calculating and processing data, a hybrid device, which is capable of simultaneously performing various functions, and the like.

The above information disclosed in this Background section is only for enhancement of understanding of the background of the invention and therefore it may contain information that does not form the prior art that is already known in this country to a person of ordinary skill in the art.

SUMMARY

The embodiments may be realized by providing a semiconductor device including a substrate; an insulating layer on the substrate, the insulating layer including a first trench and a second trench therein, the second trench having an aspect ratio that is smaller than an aspect ratio of the first trench; a barrier layer in the first trench and the second trench; a seed layer on the barrier layer in the first trench and the second trench; a first bulk layer on the seed layer and filled in the first trench; and a second bulk layer on the seed layer and filled in the second trench, wherein an average grain size of the second bulk layer is larger than an average grain size of the first bulk layer.

The embodiments may be realized by providing a semiconductor device including a substrate; an insulating layer on the substrate, the insulating layer having a first trench and a second trench, the second trench having an aspect ratio that is smaller than an aspect ratio of the first trench; a barrier layer in the first trench and the second trench; a first seed layer in the first trench and a second seed layer in the second trench, the first seed layer and the second seed layer being on the barrier layer in the first trench and the second trench; a first bulk layer on the first seed layer and filled in the first trench; and a second bulk layer on the second seed layer and filled in the second trench, wherein the first seed layer includes a first growth controlling region including a plasma material and the second seed layer includes a second growth controlling region including a plasma material, and an average concentration of plasma material included in the first growth controlling region is smaller than an average concentration of plasma material included in the second growth controlling region, or an average thickness of the first growth controlling region is less than an average thickness of the second growth controlling region.

The embodiments may be realized by providing a method of manufacturing a semiconductor device, the method including forming an insulating layer having a first trench and a second trench on a substrate such that the second trench has an aspect ratio that is smaller than an aspect ratio of the first trench; forming a barrier layer to cover the first trench and the second trench; forming a seed layer in the first trench and the second trench to cover the barrier layer; plasma-treating the seed layer; forming a first bulk layer in the first trench; and forming a second bulk layer in the second trench, wherein a process temperature of the forming of the second bulk layer is higher than a process temperature of the forming of the first bulk layer.

The embodiments may be realized by providing a semiconductor device including a substrate; an insulating layer on the substrate, the insulating layer having a first trench and a second trench, the second trench having an aspect ratio that is smaller than an aspect ratio of the first trench; a barrier layer in the first trench and the second trench; a first seed layer in the first trench and a second seed layer in the second trench, the first seed layer and the second seed layer being on the barrier layer in the first trench and the second trench; a first bulk layer on the first seed layer and filling in the first trench; and a second bulk layer on the second seed layer and filling in the second trench, wherein an average grain size of the second bulk layer is larger than an average grain size of the first bulk layer.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a trench filled structure in a semiconductor device according to an exemplary embodiment of the present disclosure will be described with reference to FIG. 1.

Figure 1:
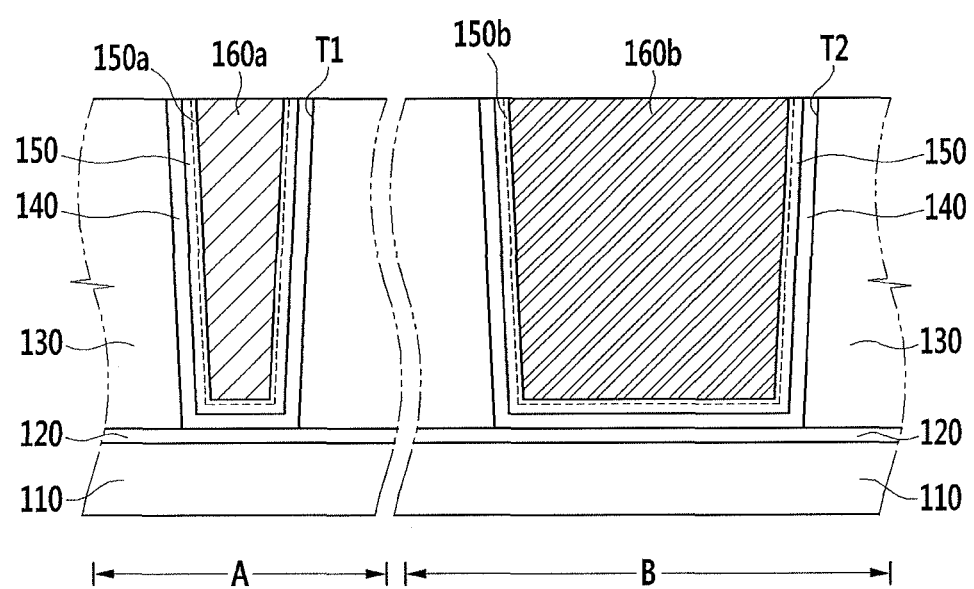
FIG. 1 illustrates a cross-sectional view of a trench filled structure of a semiconductor device according to an exemplary embodiment.

FIG. 1 illustrates a schematic cross-sectional view of a trench filled structure of a semiconductor device according to an exemplary embodiment.

Referring to FIG. 1, a trench lower layer 120 may be disposed on a substrate 110. In an implementation, the substrate 110 may be a bulk silicon substrate or a silicon (SOI) substrate on an insulating layer. In an implementation, the substrate 110 may be a silicon substrate, or may also be a substrate, in which an epi layer is formed on a base substrate. The trench lower layer 120 may be a silicide layer, a source region, a drain region, or a gate insulating layer. When the trench lower layer 120 is a silicide layer, a wiring formed in the substrate 110 may be connected to a trench filled structure, when the trench lower layer 120 is a source and/or drain region, the trench filled structure may form a contact structure with the source region and the drain region, and when the trench lower layer 120 is a gate insulating layer, the trench filled structure may form a gate.

An insulating layer 130 (having a first trench T1 and a second trench T2) may be disposed on the trench lower layer 120. In an implementation, as illustrated in FIG. 1, the insulating layer 130 may be a single layer, or may be formed in multiple layers. The insulating layer 130 may be formed by a chemical vapor depositing method.

In the present exemplary embodiment, an aspect ratio of the first trench T1 may be larger than an aspect ratio of the second trench T2. In the present exemplary embodiment, the aspect ratio may be defined by a width of an inlet of the trench:a depth of the trench.

The first trench T1 and the second trench T2 may be formed in a first region A and a second region B, respectively. The first region A and the second region B indicate different regions in a semiconductor system. The present exemplary embodiment may represent the trench filled structure in the semiconductor device disposed in each of the first region A and the second region B.

A barrier layer 140 may be conformally formed within the first trench T1 and the second trench T2. The barrier layer 140 may include, e.g., titanium, tantalum, cobalt, titanium, a nitride, a tantalum nitride, or a cobalt nitride. In an implementation, the barrier layer 140 may be formed of multiple layers formed of respective layers including a combination of the aforementioned materials. In this case, a combined material of each layer may be different for each layer.

A seed layer 150 may be disposed on the barrier layer 140. The seed layer 150 may be conformally formed along lateral surfaces and lower surfaces of the first trench T1 and the second trench T2.

The seed layer 150 may be formed of, e.g., copper, titanium, gold, silver, platinum, palladium, nickel, aluminum, rubidium, cobalt, or tungsten, or an alloy including at least one among them.

A growth controlling region may be disposed on a surface of the seed layer 150. The growth controlling region may be a region formed by a plasma treatment, which will be described in a manufacturing method to be described below.

The seed layer 150 in the first trench T1 may be a first seed layer and the seed layer 150 in the second trench T2 may be a second seed layer. The first seed layer may include a first growth controlling region 150a including a plasma material, and the second seed layer may include a second growth controlling region 150b including a plasma material. Each of the first growth controlling region 150a and the second growth controlling region 150b may be disposed on a surface of the seed layer 150. For example, a concentration of plasma material included in the seed layer 150 may be decreased from the surface of the seed layer 150 to the barrier layer 140. For example, a concentration of plasma material in a region of the seed layer 150 adjacent to the barrier layer may be less than a concentration of plasma material in the growth controlling region distal to the barrier layer 140.

A concentration of the plasma material included in the seed layer 150 disposed at a side portion of the first trench T1 may be larger than a concentration of a plasma material included in the seed layer 150 disposed under or at a bottom of the first trench T1 (e.g., adjacent to the trench lower layer 120). Similarly, a concentration of the plasma material included in the seed layer 150 disposed at a side portion of the second trench T2 may be larger than a concentration of a plasma material included in the seed layer 150 disposed under or at a bottom of the second trench T2.

In an implementation, a thickness of the first growth controlling region 150a disposed in the side portion of the first trench T1 may be larger than a thickness of the first growth controlling region 150a disposed under the first trench T1. Similarly, a thickness of the second growth controlling region 150b disposed in the side portion of the second trench T2 may be larger than a thickness of the second growth controlling region 150b disposed under the second trench T2.

As a modified exemplary embodiment, each of the first and second growth controlling regions 150a and 150b may be formed in a most region of the seed layer 150 (e.g., a majority of the seed layer 150 may be made of the first and second growth controlling regions 150a and 150b). In such a case, the concentration of the plasma material included in each of the first and second growth controlling regions 150a and 150b may still be decreased from the surface of the seed layer 150 to the barrier layer 140.

In an implementation, the first growth controlling region 150a may be formed within the first trench T1. In an implementation, plasma may be rarely or slightly irradiated to the seed layer 150 within the first trench T1 (in the plasma treatment operation of the manufacturing method to be described below) according or due to an increase in the aspect ratio of the first trench T1, and the first growth controlling region 150a may not be formed. For example, the first growth controlling region 150a may be formed only on the insulating layer 130. In an implementation, the first growth controlling region disposed on the insulating layer 130 may be extended and the first growth controlling region 150a may be formed at a part of the side portion of the first trench T1.

In an implementation, an average concentration or an average thickness of the first growth controlling region 150a may be different from an average concentration or an average thickness of the second growth controlling region 150b. This will be described with reference to FIGS. 2 and 3.

Figure 2:
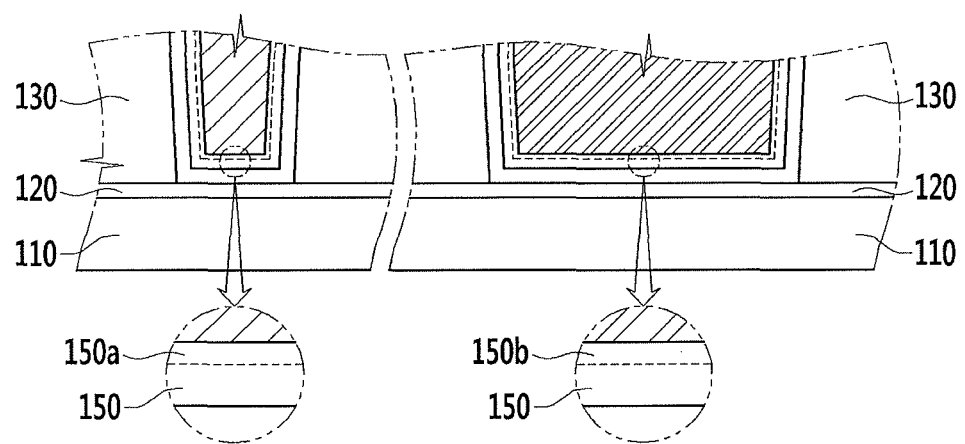
FIGS. 2 and 3 illustrate enlarged views of first and second growth controlling regions by enlarging a partial region of FIG. 1.
Figure 3:
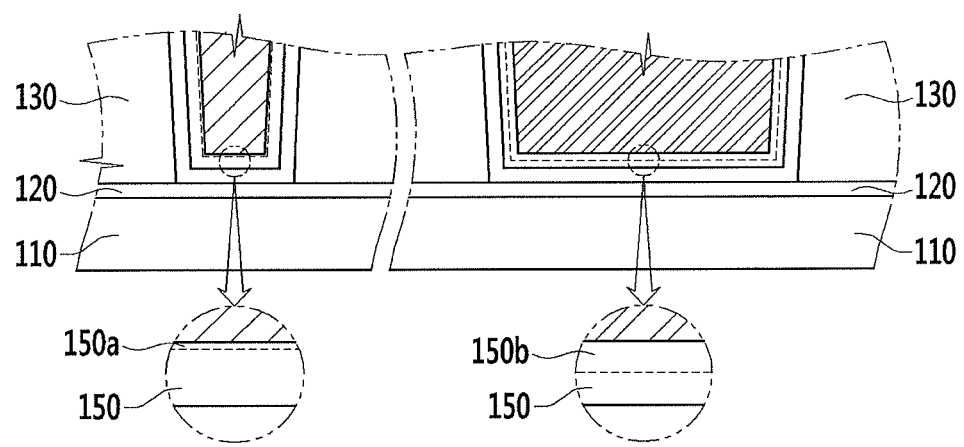

FIGS. 2 and 3 illustrate enlarged views of the first and second growth controlling regions by enlarging a partial region of FIG. 1.

Referring to FIG. 2, a (e.g., plasma) concentration of the first growth controlling region 150a disposed under or at a bottom of the first trench T1 may be smaller than a concentration of the second growth controlling region 150b disposed under or at a bottom of the second trench T2. In an implementation, when a concentration of the first growth controlling region 150a disposed in the side portion of the first trench T1 is compared with a concentration of the second growth controlling region 150b disposed in the side portion of the second trench T2 (disposed in correspondence with the first growth controlling region 150a, e.g., at a similar location), the concentration of the first growth controlling region 150a may be smaller than the concentration of the second growth controlling region 150b.

The concentration of each of the first growth controlling region 150a and the second growth controlling region 150b may be different according to a position within the first trench T1 and the second trench T2. An average concentration of the plasma material included in the first growth controlling region 150a disposed in the first trench T1 may be smaller than an average concentration of the plasma material included in the second growth controlling region 150b disposed in the second trench T2.

Referring to FIG. 3, a thickness of the first growth controlling region 150a disposed under or at a bottom of the first trench T1 may be smaller than an average thickness of the second growth controlling region 150b disposed in a second region B disposed in a lower portion or bottom of the second trench T2. In an implementation, when a thickness of the first growth controlling region 150a disposed in the side portion of the first trench T1 is compared with a thickness of the second growth controlling region 150b disposed in the side portion of the second trench T2 (disposed in correspondence with the first growth controlling region 150a, e.g., at a similar location), the thickness of the first growth controlling region 150a may be smaller than the thickness of the second growth controlling region 150b.

The thickness of each of the first growth controlling region 150a and the second growth controlling region 150b may be different according to a position within the first trench T1 and the second trench T2. An average thickness of the first growth controlling region 150a disposed in the first trench T1 may be smaller than an average thickness of the second growth controlling region 150b disposed in the second trench T2.

In FIGS. 2 and 3, the concentrations and the thicknesses of the first and second growth controlling regions 150a and 150b are separately described. An average thickness of the first growth controlling region 150a disposed in the first trench T1 may be smaller than an average thickness of the second growth controlling region 150b disposed in the second trench T2 and an average (e.g., plasma) concentration of the first growth controlling region 150a disposed in the first trench T1 may be smaller than an average concentration of the second growth controlling region 150b disposed in the second trench T2.

Referring back to FIG. 1, a bulk layer may be disposed on the seed layer 150. The bulk layer may include a first bulk layer 160a disposed in a first region A and a second bulk layer 160a disposed in the second region B. The first bulk layer 160a and the second bulk layer 160b may be completely filled in (e.g., remaining portions of) the first trench T1 and the second trench T2, respectively. In an implementation, as illustrated in FIG. 1, the first bulk layer 160a may not be formed within the second trench T2. In an implementation, the first bulk layer 160a may be slightly formed within the second trench T2.

In an implementation, the first and second bulk layers 160a and 160b may each independently include, e.g., copper, titanium, gold, silver, platinum, palladium, nickel, aluminum, rubidium, cobalt, tungsten, or an alloy thereof.

In an implementation, an average grain size of a material of the first bulk layer 160a may be smaller than an average grain size of a material of the second bulk layer 160b. This will be described with reference to FIG. 4.

Figure 4:
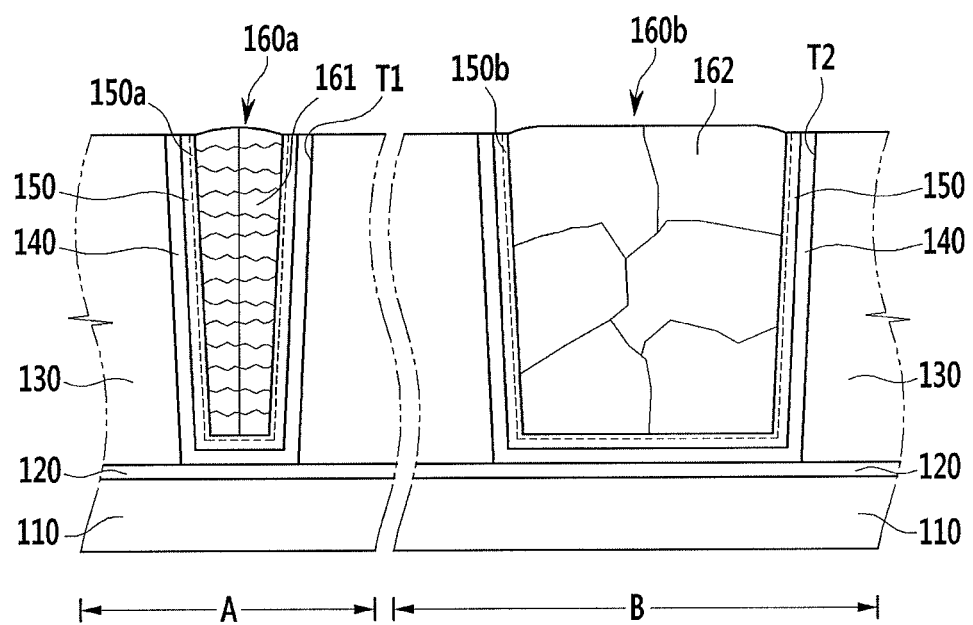
FIG. 4 illustrates a cross-sectional view of a grain shape of bulk layers formed in trenches of the semiconductor device illustrated in FIG. 1.

FIG. 4 illustrates a cross-sectional view of a grain shape and/or size of the bulk layers formed in the trenches of the semiconductor device illustrated in FIG. 1.

Referring to FIG. 4, first grains 161 may be generated in the first bulk layer 160a, and an average grain size of the first grains 161 may be smaller than a width of the first trench T1. Second grains 162 may be generated in the second bulk layer 160b, and an average grain size of the second grains 162 may be larger than the average grain size of the first grains 161.

In an implementation, each of the first bulk layer 160a and the second bulk layer 160b according to the present exemplary embodiment may be formed of, e.g., tungsten. In an implementation, as described above, the first bulk layer 160a and the second bulk layer 160b may be formed of the same material. In an implementation, the first bulk layer 160a and the second bulk layer 160b may include different materials.

In the present exemplary embodiment, the plasma may be processed on the trenches T1 and T2 having the different aspect ratios (as described in the manufacturing method to be described below), the first bulk layer 160a may be sequentially formed in the first trench T1 having a relatively small width from a bottom of the first trench T1 in an up direction (e.g., away from the substrate 110), so that it is possible to help prevent a seam or a void from being generated. The second bulk layer 160b may be separately formed in the second trench T2 (having a relatively large width), and the average grain sizes of the first bulk layer 160a and the second bulk layer 160b may be different from each other.

Figure 5:
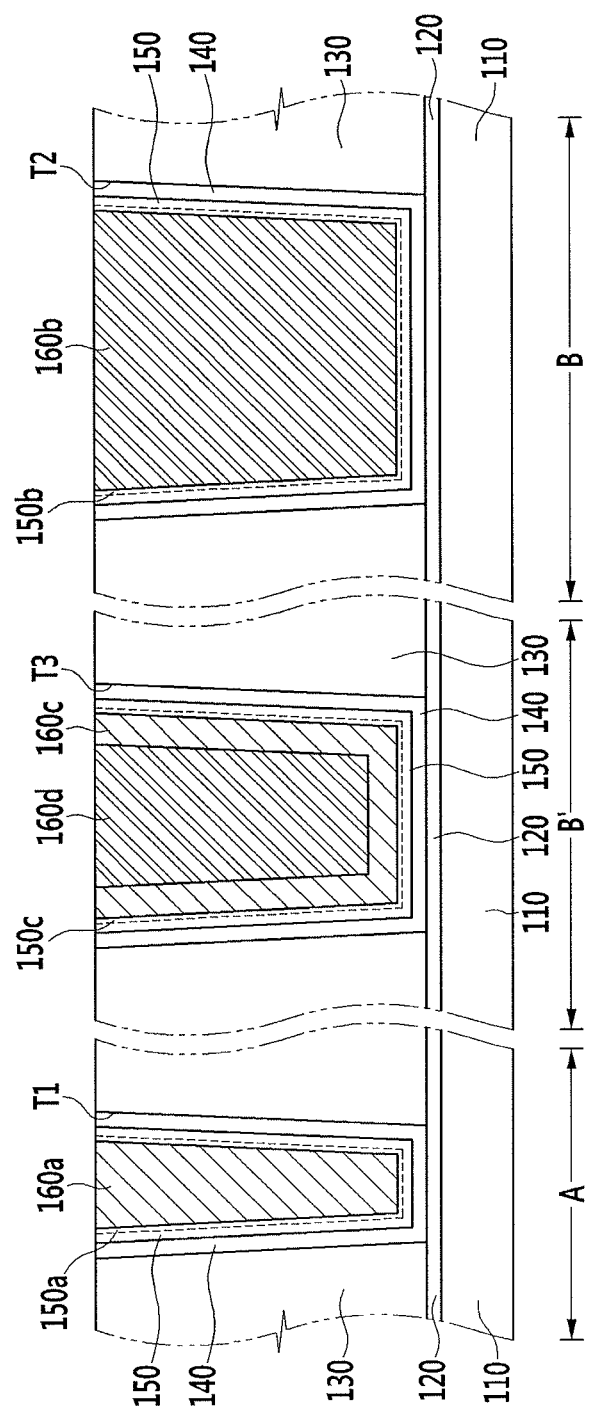
FIG. 5 illustrates a cross-sectional view of a trench filled structure of a semiconductor device according to an exemplary embodiment.
Figure 6:
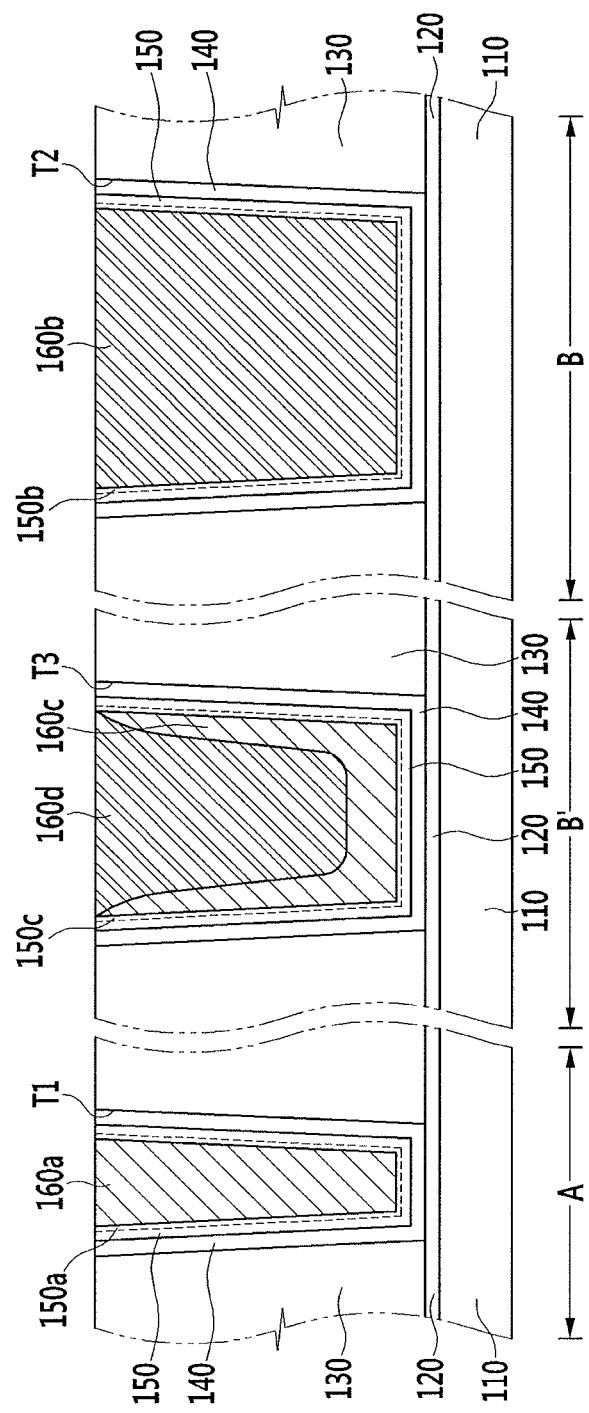
FIG. 6 illustrates a cross-sectional view of a modified structure of a third bulk layer illustrated in the exemplary embodiment of FIG. 5.

FIG. 5 illustrates a cross-sectional view of a trench filled structure of a semiconductor device according to an exemplary embodiment. FIG. 6 illustrates a cross-sectional view of a modified structure of a third bulk layer in the exemplary embodiment of FIG. 5.

Referring to FIG. 5, the semiconductor device according to the present exemplary embodiment may further include a structure of a filled third trench T3 formed in a third region B'. For example, the exemplary embodiment described with reference to FIG. 1 represents the trench filing structure in the first and second regions A and B. In the present exemplary embodiment, the semiconductor device may further include a trench filled structure disposed in the third region B', other than or different from the first and second regions A and B. Hereinafter, only the different matters from those of the exemplary embodiment of FIG. 1 will be described.

Referring to FIG. 5, a barrier layer 140 may be conformally formed within a third trench T3 in the third region B'. A seed layer 150 including a third growth controlling region 150c may be disposed on the barrier layer 140, and a third bulk layer 160c and a fourth bulk layer 160d may be sequentially disposed on the seed layer 150.

An aspect ratio of the third trench T3 according to the present exemplary embodiment may be smaller than an aspect ratio of a first trench T1 and may be larger than an aspect ratio of the second trench T2.

When the seed layer 150 disposed within the third trench T3 is referred to as a third seed layer, the third seed layer may include the third growth controlling region 150c including a plasma material. The third growth controlling region 150c may be disposed on or at a surface of the seed layer 150, and a concentration of the plasma included in the third growth controlling region 150c may be decreased from the surface of the seed layer 150 to the barrier layer 140. In an implementation, the third growth controlling region 150c may be formed in the most region of the seed layer 150 (e.g., the majority of the seed layer 150 may be made up of the third growth controlling region 150c), and the concentration of the plasma material included in the third growth controlling region 150c may be decreased from the surface of the seed layer 150 to the barrier layer 140.

In an implementation, an average concentration or an average thickness of the third growth controlling region 150c may be different from average concentrations or the average thicknesses of first and second growth controlling regions 150a and 150b. In an implementation, an average concentration of the plasma material included in the third growth controlling region 150c may be larger than an average concentration of the plasma material included in the first growth controlling region 150a and may be smaller than an average concentration of the plasma material included in the second growth controlling region 150b. In an implementation, an average thickness of the third growth controlling region 150c may be larger than an average thickness of the first growth controlling region 150a and may be smaller than an average thickness of the second growth controlling region 150b.

The third bulk layer 160c may be disposed on the seed layer 150 in the third region B'. The third bulk layer 160c may be conformally formed along the surface of the seed layer 150. The third bulk layer 160c may be simultaneously formed with the first bulk layer 160a in the first region A. In an implementation, different from the conformally formed third bulk layer 160c in FIG. 5, referring to FIG. 6 as a modified exemplary embodiment, the third bulk layer 160c may be formed to be relatively thin in a side portion of the third trench T3 and to be relatively thick in a lower portion of the third trench T3.

A fourth bulk layer 160d may be disposed on the third bulk layer 160c. The fourth bulk layer 160d may be completely filled in the third trench T3 (e.g., may fill remaining portions of the third trench T3). The fourth bulk layer 160d may be simultaneously formed with the second bulk layer 160b in the second region B.

In an implementation, as illustrated in FIGS. 5 and 6, the first bulk layer 160a and the third bulk layer 160c may not be formed within the second trench T2 at all. In an implementation, the material forming the first bulk layer 160a and the third bulk layer 160c may also be slightly formed within the second trench T2.

In the present exemplary embodiment, an average grain size of a material of the third bulk layer 160c may be smaller than an average grain size of a material of the fourth bulk layer 160d. This will be described with reference to FIG. 7.

Figure 7:
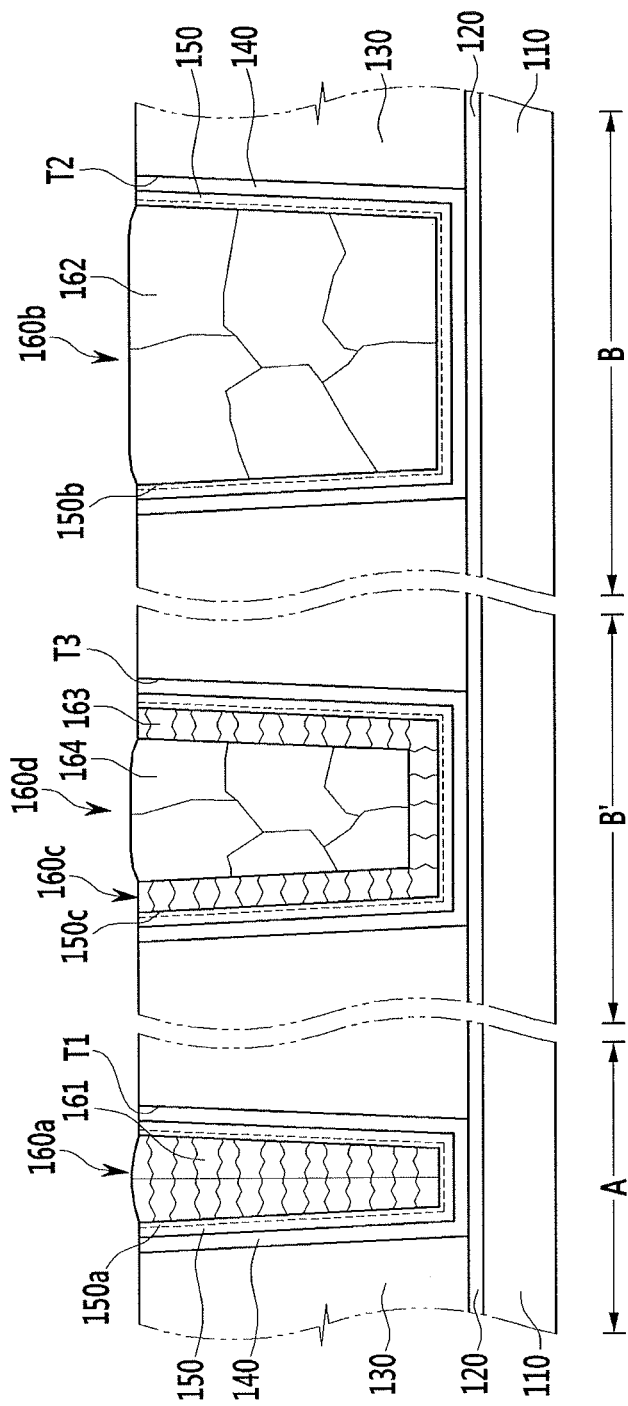
FIG. 7 illustrates a cross-sectional view of a grain shape of bulk layers formed in trenches of the semiconductor device illustrated in FIG. 5.

FIG. 7 illustrates a cross-sectional view of a grain shape of the bulk layers formed in the trenches of the semiconductor device illustrated in FIG. 5.

Referring to FIG. 7, third grains 163 may be generated in the third bulk layer 160c, and an average grain size of the third grains 163 may be equal to or smaller than an average grain size of the first grains 161 of the first bulk layer 160a formed in the first trench T1. Fourth grains 164 may be generated in the fourth bulk layer 160d, and an average grain size of the fourth grains 164 may be larger than the average grain size of the third grains 163. The average grain size of the fourth grains 164 may be equal to or smaller than an average grain size of the second grains 162 of the second bulk layer 160b formed in the second trench T2.

In addition to the difference described above, all of the contents described with reference to FIGS. 1 to 4 may be applied to the present exemplary embodiment.

Hereinafter, an example of a method of manufacturing the semiconductor device according to the exemplary embodiment will be described.

FIGS. 8 to 15 illustrate cross-sectional views of stages in a method of manufacturing a semiconductor device according to an exemplary embodiment.

Figure 8:
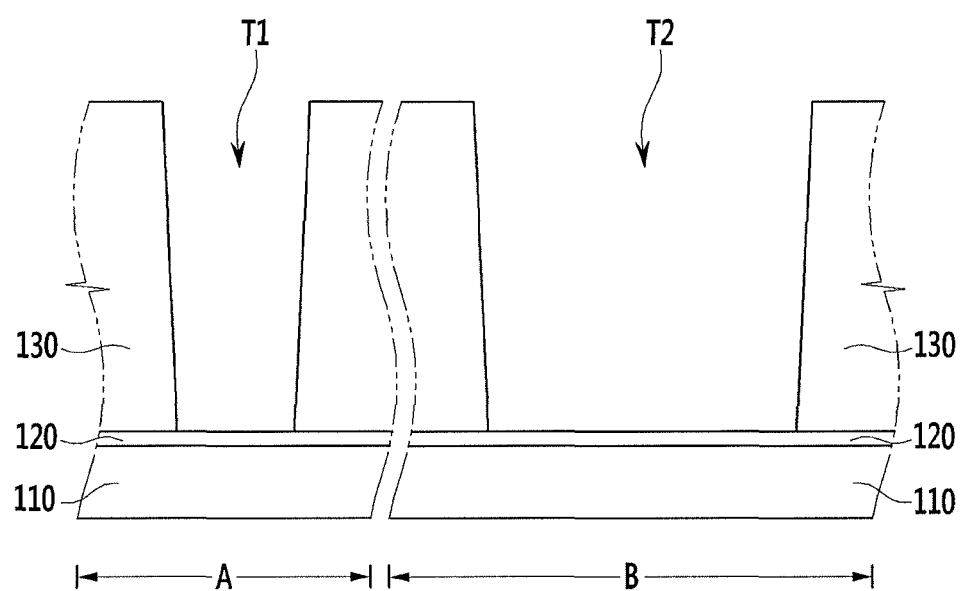
FIGS. 8 to 15 illustrate cross-sectional views of stages in a method of manufacturing a semiconductor device according to an exemplary embodiment.

Referring to FIG. 8, a trench lower layer 120 may be formed on a substrate 110.

The trench lower layer 120 may correspond to, e.g., a silicide layer, a source region, a drain region, or a gate insulating layer according to the type of contact structure or device to be formed.

An insulating layer 130 (having a first trench T1 and a second trench T2) may be formed on the trench lower layer 120 by a chemical vapor depositing method or the like. For example, an aspect ratio of the first trench T1 may be larger than an aspect ratio of the second trench T2. The first trench T1 and the second trench T2 may be formed in a first region A and a second region B, respectively, and the first region A and the second region B may correspond to different regions of a system LSI. Accordingly, the degrees of integration of the regions A and B may be different from each other, and the first trench T1 and the second trench T2 formed in the first region A and the second region B, respectively, may have different aspect ratios.

Figure 9:
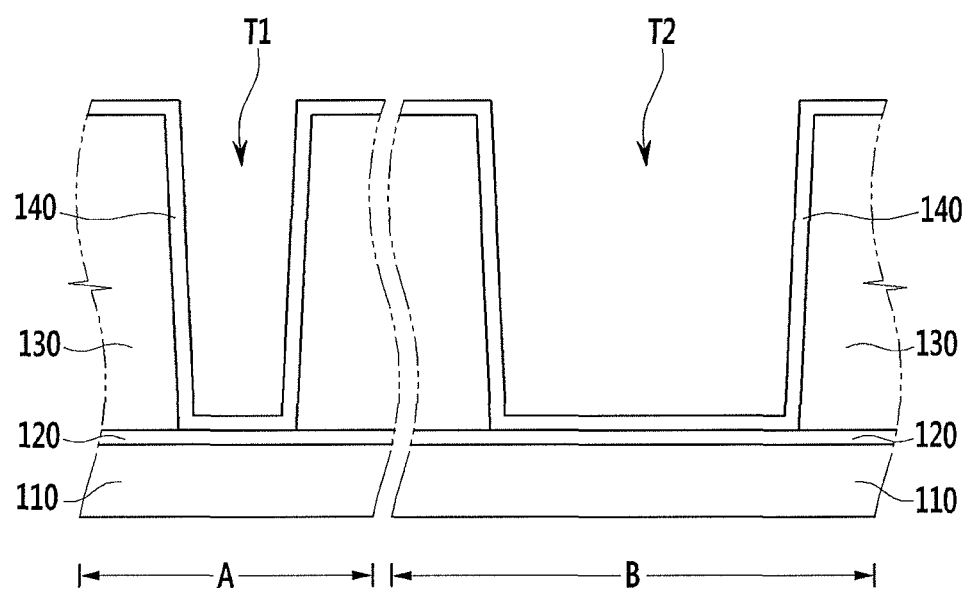

Referring to FIG. 9, a barrier layer 140 may be formed on the insulating layer 130 so as to cover internal sides of the first trench T1 and the second trench T2.

The barrier layer 140 may be formed by, e.g., a chemical vapor depositing method, a sputtering method, or an atomic layer deposition method, and may be formed in a single layer or may also be formed in multiple layers by laminating a layer so as to include, e.g., titanium, tantalum, cobalt, a titanium nitride, a tantalum nitride, or a cobalt nitride. When the barrier layer 140 is formed of titanium and a titanium nitride, the titanium and the titanium nitride may be formed by one process.

The barrier layer 140 may help prevent a metal included in a seed layer or a bulk layer formed by a subsequent process from being dispersed to the substrate 110 or the insulating layer 130.

Figure 10:
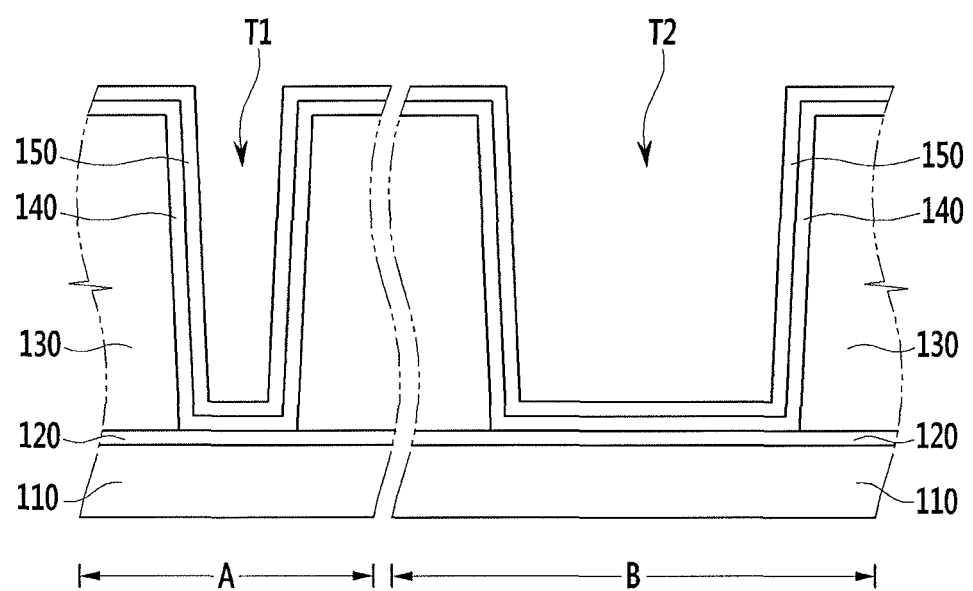

Referring to FIG. 10, a seed layer 150 may be formed on the barrier layer 140.

The seed layer 150 may be conformally formed along lateral surfaces and lower surfaces of the internal sides of the first trench T1 and the second trench T2, and may also be formed on an upper surface of the insulating layer 130.

The seed layer 150 may be formed of, e.g., copper, titanium, gold, silver, platinum, palladium, nickel, aluminum, rubidium, cobalt, or tungsten, or may also be formed of an alloy including at least one among them. The seed layer 150 may enable a bulk layer to be formed or facilitate the forming of a bulk layer in a subsequent process.

Figure 11:
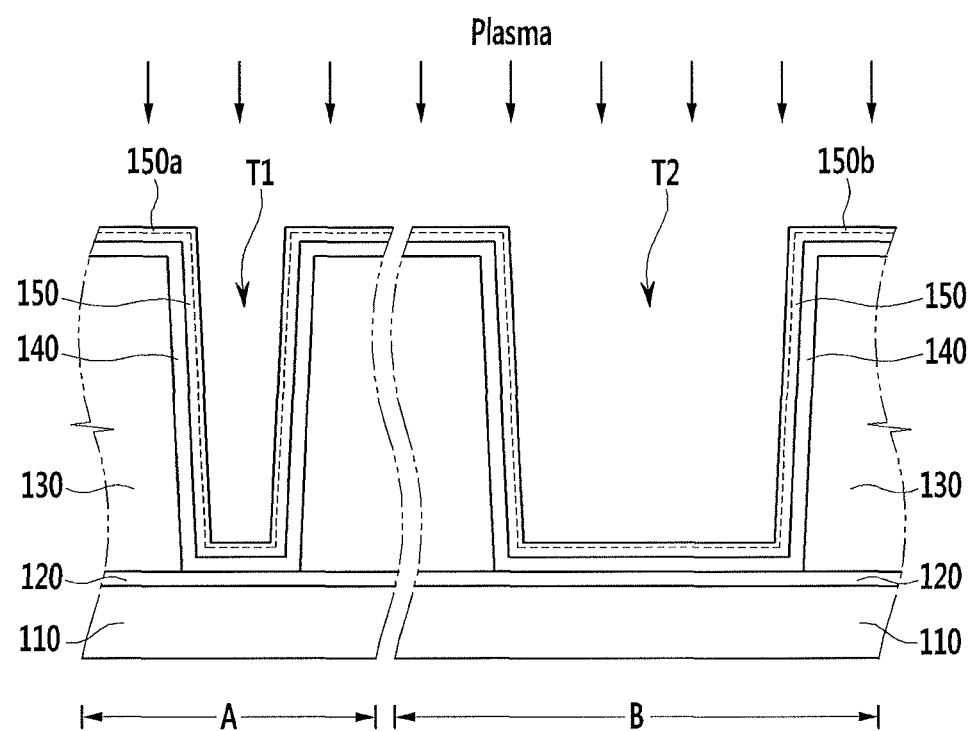

Referring to FIG. 11, a plasma treatment may be performed on the seed layer 150.

An exposed surface of the seed layer 150 may be plasma treated, and a first growth controlling region 150a may be formed in the first region A along the surface of the seed layer 150, and a second growth controlling region 150b may be formed in the second region B along the surface of the seed layer 150. For example, an aspect ratio of the first trench T1 may be larger than an aspect ratio of the second trench T2, and a width of the first trench T1 may be smaller than a width of the second trench T2, so that intensity of the plasma treated on the surface of the seed layer 150 disposed in the first trench T1 may be lower than intensity of the plasma treated on the surface of the seed layer 150 on the insulating layer 130 around the first trench T1 and intensity of the plasma treated on the surface of the seed layer 150 of the second region B.

In an implementation, the aspect ratio of the second trench T2 may be smaller than the aspect ratio of the first trench T1 and a width of the second trench T2 may be relatively large, and the intensity of the plasma treated on the surface of the seed layer 150 disposed in the second trench T2 may be substantially the same as the intensity of the plasma treated on the surface of the seed layer 150 on the insulating layer 130 around the first trench T1 or on the insulating layer 130 around the second trench T2.

As descried above, the seed layers 150 formed in the first trench T1 and the second trench T2, which have different aspect ratios, may be simultaneously plasma-processed in the semiconductor device according to the present exemplary embodiment, so that, as illustrated in FIGS. 2 and 3, growth controlling regions having different concentrations or different thicknesses may be formed in the seed layer 150 within the first trench T1 and the seed layer 150 within the second trench T2.

In an implementation, the first growth controlling region 150a and the second growth controlling region 150b may be formed on the surface of the seed layer 150. For example, even though the intensity of plasma may be increased or even though the intensity of plasma may have the same condition, when a thickness of the seed layer 150 is small, a space occupied by the growth controlling region distributed within the seed layer 150 may be increased.

Figure 12:
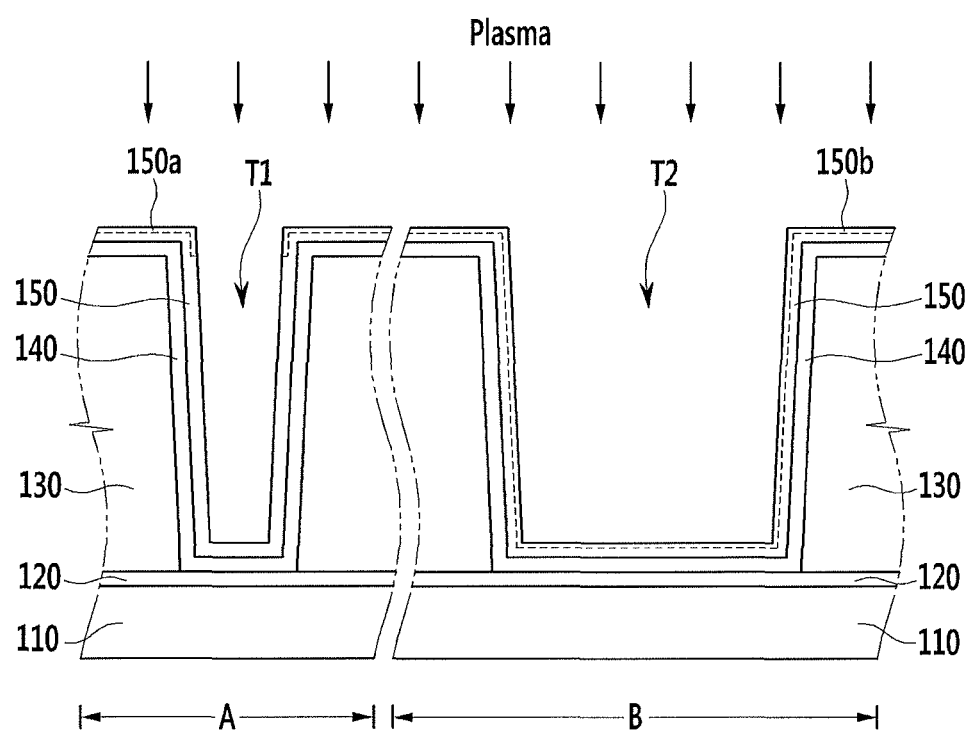

As illustrated in FIG. 12, the first growth controlling region 150a may be formed on or adjacent to only an upper portion of the insulating layer 130 in the first region A. The plasma may be rarely irradiated to the seed layer 150 within the first trench T1 in the plasma treatment operation, or the intensity of plasma may be adjusted in the plasma treatment operation according to the increase in the aspect ratio of the first trench T1, so that the first growth controlling region 150a may not be formed in the seed layer 150 within the first trench T1.

A suitable plasma device may be used as a plasma device used in the plasma treatment operation, e.g., a remote plasma technology, in which plasma is generated in a region spaced apart from the substrate 110, may be applied.

The plasma treatment operation may be performed by using a nitrogen-containing gas, e.g., $N_2$, $N_2H_4$, $NH_3$, or a mixed gas thereof. The surface of the seed layer 150 before the plasma treatment may have an unstable energetic surface defect. Accordingly, activated atoms or ions, e.g., nitrogen atoms or nitrogen ions, may be bonded with the surface defect by the plasma to form dangling bonding, and thus it is possible to energetically stabilize the surface of the seed layer 150.

Further, depending on a case, hydrogen atoms or hydrogen ions may be bonded with the surface of the seed layer 150 to form dangling bonding.

A process condition of the plasma treatment will be illustratively described. The nitrogen-containing gas used in the plasma treatment operation may have a flow rate in a range, e.g., from 1 sccm to 50 sccm. Further, the plasma treatment operation may be performed by using inactive or inter gas, e.g., argon gas, krypton gas, or xenon gas together, and the inactive gas may have a flow rate in a range from 1 sccm to 20 sccm. Further, the plasma treatment operation may be performed under RF power in a range of 1 W to 2,000 W. Further, the plasma treatment operation may be performed without applying bias power. Further, a process temperature of the plasma treatment operation may be in a range of −50° C. to 250° C., and pressure may be 8 mTorr or less.

In the present exemplary embodiment, plasma may be irradiated to the seed layer 150 disposed within the trenches having different aspect ratios, e.g., different widths, so that even though the plasma under the same condition is treated, the plasma with different intensities may be irradiated according to the position of the seed layer 150. In this case, the first growth controlling region 150a may be formed on or adjacent to the insulating layer 130 in a first region A1 to suppress the growth of a bulk layer to be described below, and the first growth controlling region 150a, which has a relatively low concentration or small thickness, may be formed on the seed layer 150 within the first trench T1 or the first growth controlling region 150a may not be formed, so that the bulk layer may be first grown from the surface of the seed layer 150 disposed in the lower portion of the first trench T1.

Figure 13:
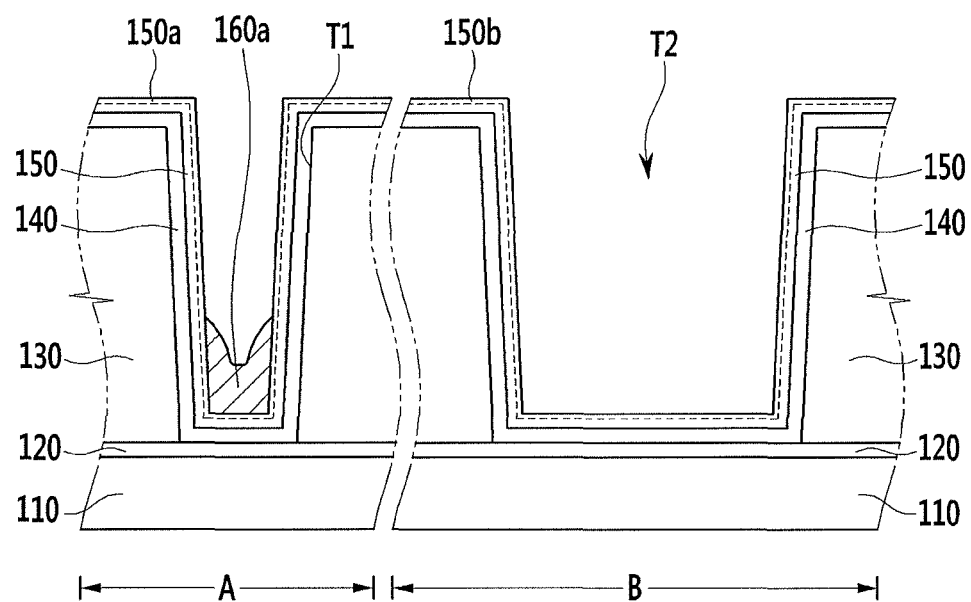
Figure 14:
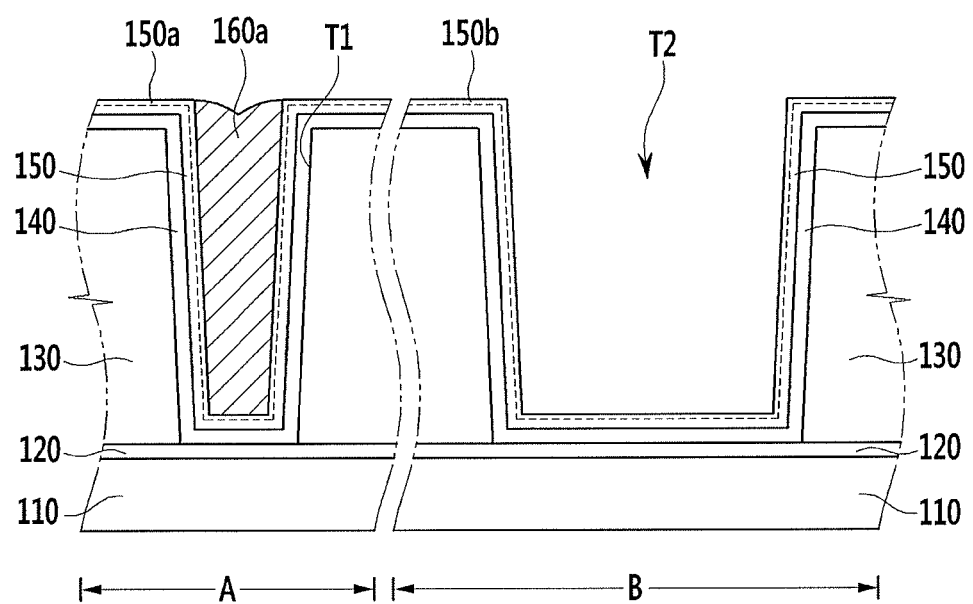

Referring to FIGS. 13 and 14, a first bulk layer 160a may be formed on the seed layer 150.

The first bulk layer 160a may use at least one of various tungsten contained gas including, e.g., $WF_6$, $WCl_6$, and $W(CO)_6$, and may be formed by using at least one of reducing agents including, e.g., silane ($SiH_4$), disilane ($Si_2H_6$), hydrazine ($N_2H$), diborane ($B_2H_6$), and germanes ($GeH_4$). The first bulk layer 160a may be formed of the same material as that of the seed layer 150. For example, the first bulk layer 160a may be include copper, titanium, gold, silver, platinum, palladium, nickel, aluminum, rubidium, cobalt, tungsten, or an alloy thereof.

Referring to FIG. 13, even though the first bulk layer 160a may be deposited on the seed layer 150 under the same process treatment as described above, the seed layer 150 in the lower portion of the second trench T2 may be in an energetically stable state by the second growth controlling region 150b, so that the first bulk layer 160a may not be formed in the second trench T2. Further, in the first trench T1, the growth of the first bulk layer 160a may begin from the surface of the seed layer 150 disposed in the lower portion of the first trench T1. As described above, the first bulk layer 160a may be grown from the lower portion of the first trench T1 and may be filled in the first trench T1, so that the first trench T1 may be completely filled with the first bulk layer 160a as illustrated in FIG. 14 without a seam or a void.

A first process temperature in the operation of forming the first bulk layer 160a may have a range of about 200° C. to 400° C.

In an implementation, as illustrated in FIG. 14, the first bulk layer 160a may be formed only within the first trench T1. In an implementation, the first bulk layer 160a may be slightly formed within the second trench T2.

Figure 15:
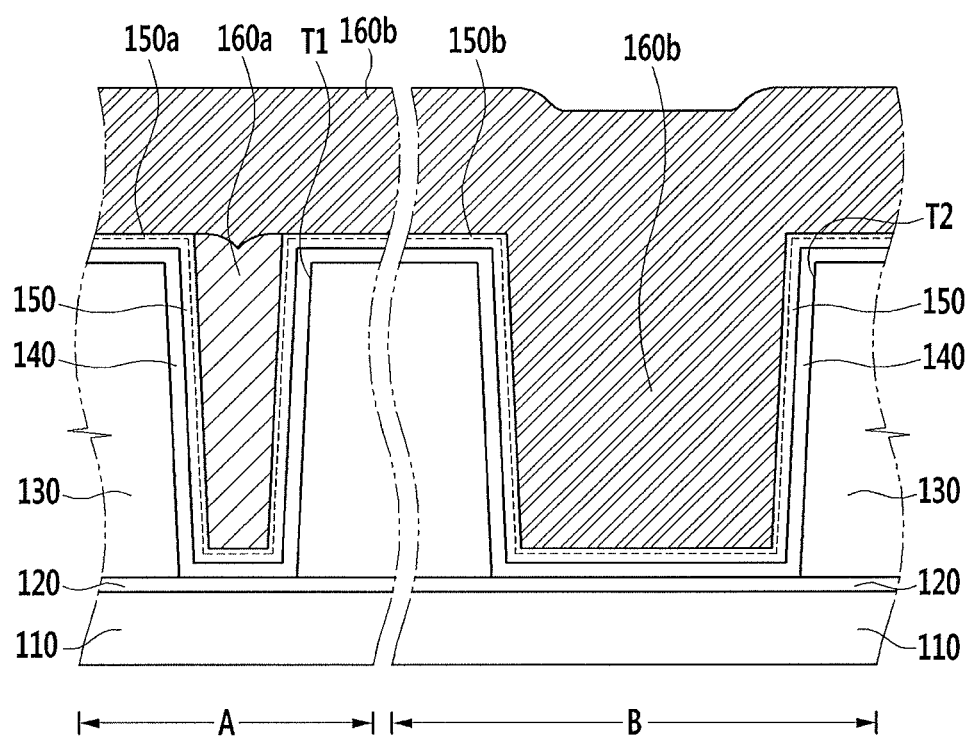

Referring to FIG. 15, a second bulk layer 160b may be formed on the first bulk layer 160a and the seed layer 150.

In an implementation, the second bulk layer 160b may be formed of the same material as that of the first bulk layer 160a. In the present exemplary embodiment, a second process temperature for forming the second bulk layer 160b may be higher than the aforementioned first process temperature of the first bulk layer 160a. For example, the second growth controlling region 150b (suppressing formation of the second bulk layer 160b) may be on the surface of the seed layer 150 disposed in the lower portion of the second trench T2, and a growth rate may be increased by increasing the second process temperature. As a result, as illustrated in FIG. 4, an average grain size of the second bulk layer 160b may be larger than an average grain size of the first bulk layer 160a. In an implementation, the second process temperature may have a range of about 250° C. to 450° C.

In the operation of forming the second bulk layer 160b, the second bulk layer 160b may be formed even on the first bulk layer 160a filled in the first trench T1. For example, the first region A may have a structure, in which the second bulk layer 160b having the larger average grain size is disposed on the first bulk layer 160a. When a planarization process is performed after the second bulk layer 160b is formed, the second bulk layer 160b in the first region A may be removed. The planarization process may be performed so that the upper surface of the insulating layer 130 is exposed. When the planarization process is performed as described above, it is possible to form the trench filled structure of the semiconductor device according to the exemplary embodiment illustrated in FIG. 1.

In an implementation, the planarization process may use a CMP process or an etch back process.

FIGS. 16 to 19 illustrate cross-sectional views of stages in a modified example of the method of manufacturing the semiconductor device described in FIGS. 8 to 15.

Figure 16:
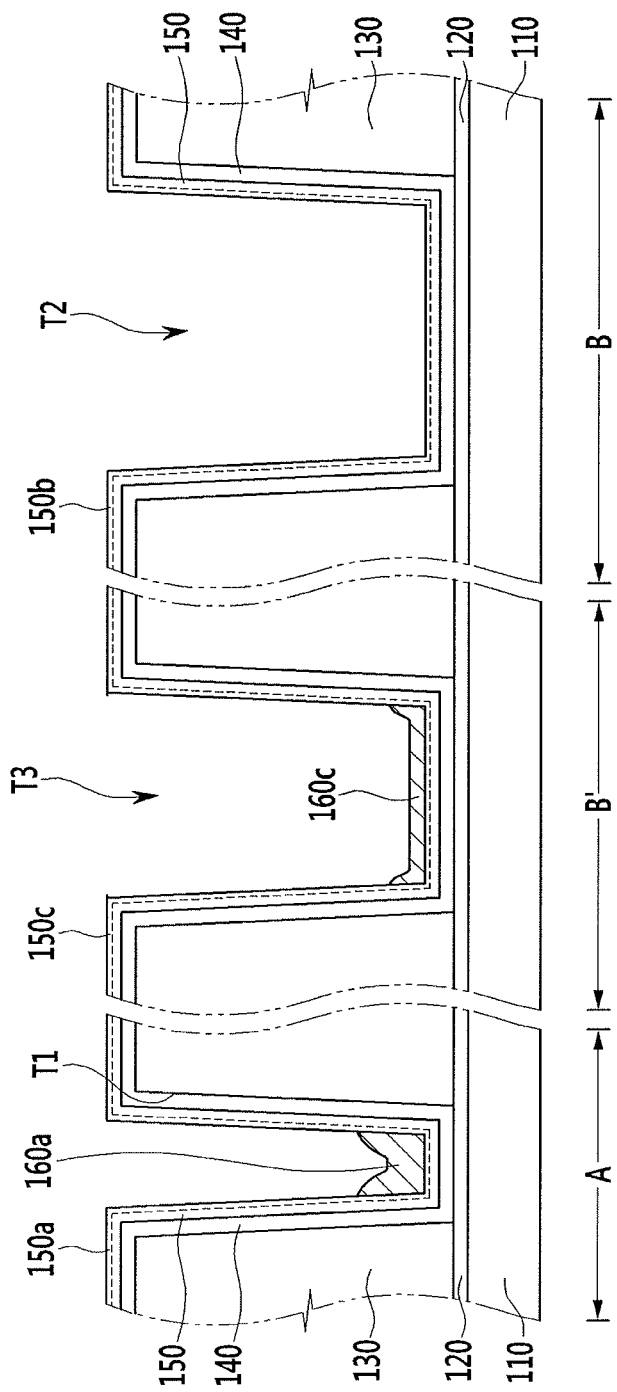
FIGS. 16 to 19 illustrate cross-sectional views of stages in a modified example of the method of manufacturing the semiconductor device described in FIGS. 8 to 15.

Referring to FIG. 16, a method of manufacturing a semiconductor device according to the present exemplary embodiment may further include a method of manufacturing a filled structure of a third trench T3 in a third region B'. For example, the exemplary embodiment described with reference to FIGS. 8 to 15 represents the method of manufacturing the trench filled structure in the first and second regions A and B, but in the present exemplary embodiment, the method may further include a method of manufacturing a structure related to the third region B', other than or different from the first and second regions A and B.

Hereinafter, only the parts different from those of the exemplary embodiment of FIGS. 8 to 15 will be described.

A barrier layer 140 and a seed layer 150 may be formed within a third trench T3 in the third region B', similar to a first trench T1 and a second trench T2, as illustrated in FIG. 16, by performing the same process as the operations described with reference to FIGS. 8 to 12. An aspect ratio of the third trench 13 may be smaller than an aspect ratio of the first trench T1 and may be larger than an aspect ratio of the second trench T2. For example, a width of the third trench T3 may be larger than a width of the first trench T1 and may be smaller than a width of the second trench T2.

Then, when a plasma treatment is performed on the seed layer 150, a third growth controlling region 150c may be formed in the third region B' as illustrated in FIG. 16, and as described in the exemplary embodiment of the structure of FIG. 6, an average concentration or an average thickness of the third growth controlling region 150c may be different from the average concentrations or the average thicknesses of the first and second growth controlling regions 150a and 150b. In this case, when the plasma for the treatment is strong, a thickness of a third bulk layer 160c, which is described below, formed in the third trench T3 may be small, and when the plasma for the treatment is weak, a thickness of the third bulk layer 160c may be large.

In a case where a low-resistant contact is important in a contact structure formed in the third trench T3, a thickness of the third bulk layer 160c may be small by controlling the intensity of plasma for the treatment to be large, and then, a thickness of a fourth bulk layer 160d, which is illustrated in FIG. 6, formed on the third bulk layer 160c may be formed to be relatively large.

In contrast to this, in a case where a device characteristic, such as a barrier characteristic, is more important in the contact structure formed in the third trench T3, a thickness of the third bulk layer 160c may also be formed to be relatively larger than that of the fourth bulk layer 160d unlike the illustration of FIG. 6 by controlling the intensity of plasma for the treatment to be small.

Referring to FIG. 16, the first bulk layer 160a may be formed on the seed layer 150 within the first trench T1, and the third bulk layer 160c may be formed on the seed layer 150 of the third trench T3. In this case, in the first trench T1, the growth of the first bulk layer 160a may begin from the surface of the seed layer 150 in the lower portion of the first trench T1. Similar to the first trench T1, in the second trench T2, the third bulk layer 160c may be grown from the surface of the seed layer 150 in a lower portion of the second trench T2. The seed layer 150 in a lower portion of the second trench T2 may be in an energetically stable state by the second growth controlling region 150b, so that the first bulk layer 160a or the third bulk layer 160c may not be formed in the second trench T2.

Figure 17:
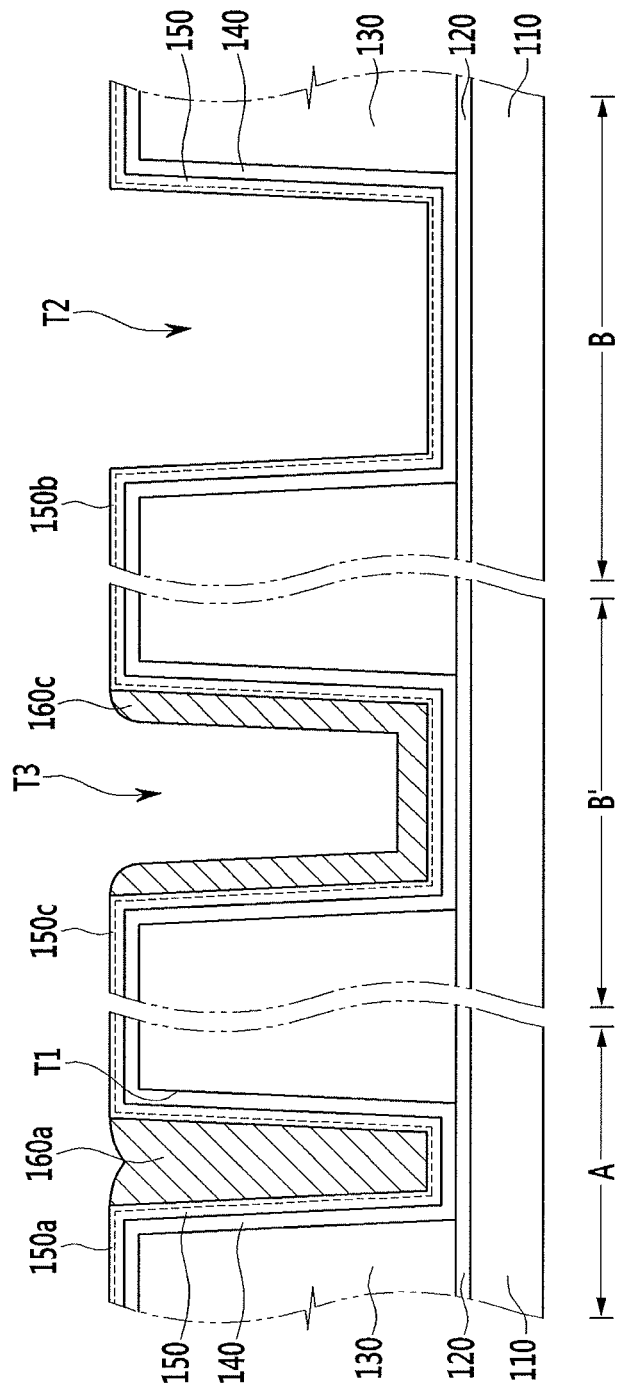
Figure 18:
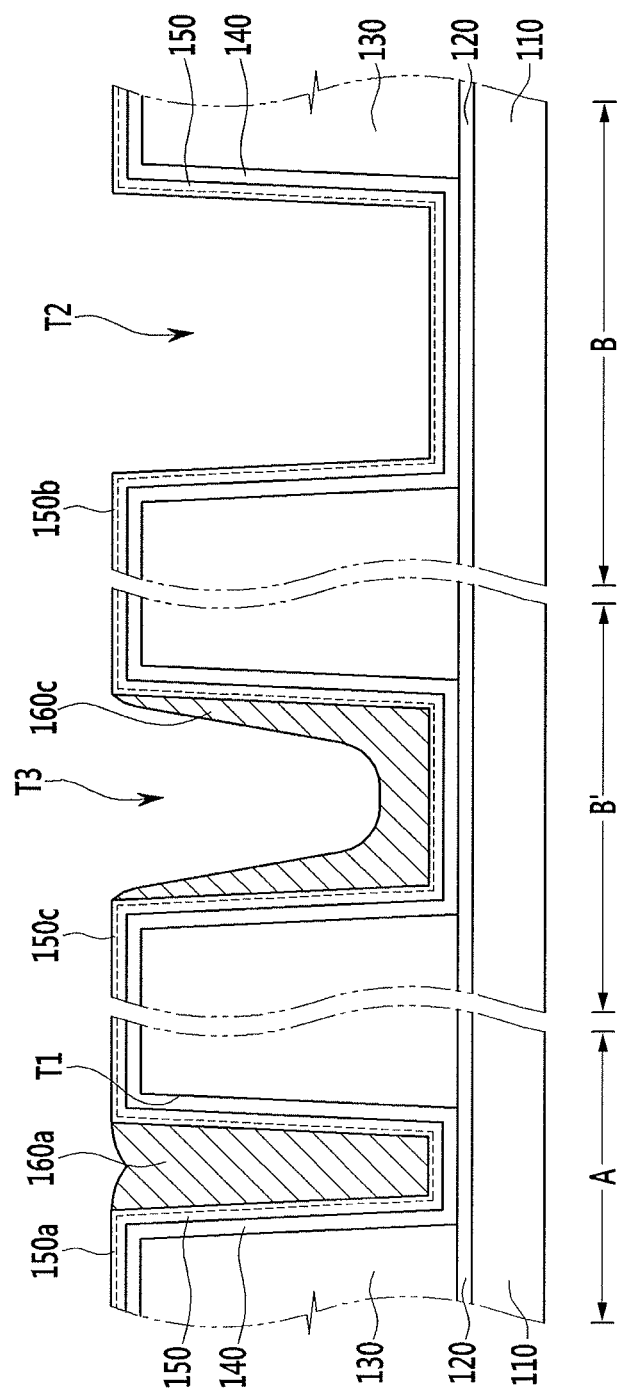

Referring to FIG. 17, the degree of stabilization of the seed layer 150 may be different for each region by a difference in an average concentration or an average thickness of the first growth controlling region 150a, the second growth controlling region 150b, and the third growth controlling region 150c. Accordingly, even though the bulk layer is formed on the seed layer 150 under the same process condition, the first bulk layer 160a may be formed in the first region A while being completely filled in the first trench T1, the bulk layer may not be formed in the second region B in the present operation, and the third bulk layer 160c may be conformally formed on the seed layer 150 of the third trench T3 in the third region B'. Referring to FIG. 18 as the modified exemplary embodiment of the conformally formed third bulk layer 160c, the third bulk layer 160c may be relatively thin in a side portion of the third trench T3 and may be relatively thick in a lower portion of the third trench T3.

The first bulk layer 160a and the third bulk layer 160c may be simultaneously formed, and may be formed of the same material. As illustrated in FIG. 7, an average grain size of third grains 163 of the third bulk layer 160c may be equal to or smaller than an average grain size of first grains 161 of the first bulk layer 160a.

A first process temperature in the operation of forming the first bulk layer 160a and the third bulk layer 160c may have a range of about 200° C. to 400° C.

In an implementation, the first bulk layer 160a and the third bulk layer 160c may not be formed within the second trench T2 at all as illustrated in FIGS. 17 and 18, or the material forming the first bulk layer 160a and the third bulk layer 160c may also be slightly formed within the second trench T2.

Figure 19:
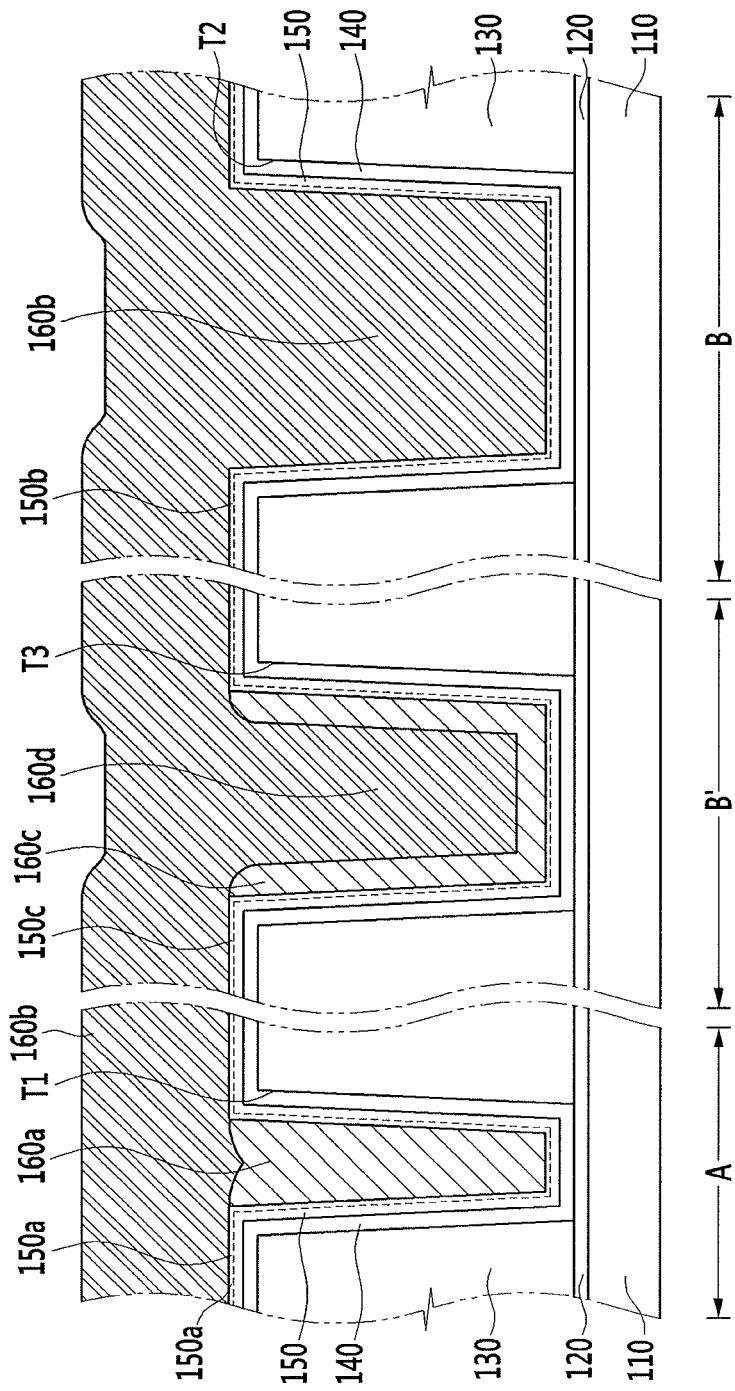

Referring to FIG. 19, a second bulk layer 160b may be formed on the first bulk layer 160a, the third bulk layer 160c, and the seed layer 150.

The second bulk layer 160b may be formed of the same material as that of the first bulk layer 160a and the third bulk layer 160c. In the present exemplary embodiment, a second process temperature for forming the second bulk layer 160b may be higher than the aforementioned first process temperature of the first bulk layer 160a. For example, the second growth controlling region 150b suppressing the second bulk layer 160b from being formed may be formed on the surface of the seed layer 150 disposed in the second trench T2, so that it may be difficult to form the second bulk layer 160b under the same condition as that when the first bulk layer 160a and the third bulk layer 160c are formed. Accordingly, a growth rate may be increased by increasing the second process temperature, and as a result, as illustrated in FIG. 7, the second bulk layer 160b may be formed so that a grain size of the second bulk layer 160b may be larger than an average grain size of the first bulk layer 160a and the third bulk layer 160c.

In the operation of forming the second bulk layer 160b, the second bulk layer 160b may be completely filled in the third trench T3 (e.g., may completely fill remaining portions of the third trench T3). The second bulk layer 160b may also be formed on the first bulk layer 160a filled in the first trench T1. In this case, a structure, in which the second bulk layer 160b having the larger average grain size than that of the first bulk layer 160a is disposed on the first bulk layer 160a, may be present in the first region A, and a structure, in which the second bulk layer 160b having the larger average grain size than that of the third bulk layer 160c is disposed on the third bulk layer 160c, may be present in the third region B'. A planarization process may be performed after the second bulk layer 160b is formed, and thus the second bulk layer 160b in the first region A may be removed, and the second bulk layer 160b corresponding to a part left after being filled in the third trench T3 in the second region B may be removed (e.g., portions outside of the third trench T3 may be removed). The planarization process may be performed so that the upper surface of the insulating layer 130 is exposed, and when the planarization process is performed as described above, it is possible to form a trench filled structure of the semiconductor device according to the exemplary embodiment illustrated in FIG. 6.

Hereinafter, a semiconductor device, to which the aforementioned trench filled structure is applied, will be schematically described.

Figure 20:
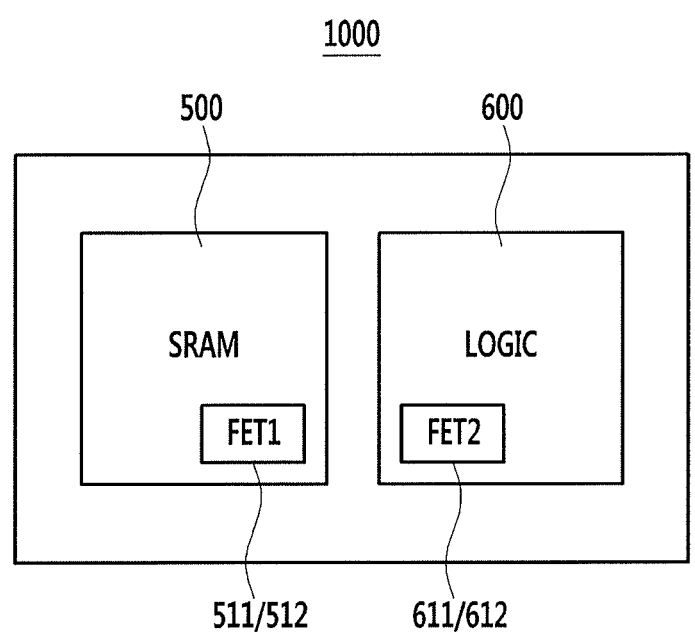
FIG. 20 illustrates a block diagram schematically showing a semiconductor device according to an exemplary embodiment.

FIG. 20 illustrates a block diagram schematically showing a semiconductor device according to an exemplary embodiment.

Referring to FIG. 20, a semiconductor device 1000 according to an exemplary embodiment may be a system LSI, e.g., an application processor (AP), including an SRAM formed region 500 and a logic region 600. A first transistor 511 and a third transistor 512 may be disposed in the SRAM formed region 500, and a second transistor 611 and a fourth transistor 612 may be disposed in the logic region 600. Herein, the degree of integration of the SRAM formed region 500 may be relatively larger than the degree of integration of the logic region 600.

FIG. 20 illustratively shows the SRAM formed region 500 and the logic region 600. In an implementation, the exemplary embodiments according to the present disclosure may be applied to a passive device region or an input/output pad forming region, instead of the logic region 600, in the system LSI, and a region, e.g., DRAM, MRAM, RRAM, and PRAM formed regions, in which different types of devices corresponding to a memory device, are formed, instead of the SRAM formed region 500.

Hereinafter, a case where the manufacturing method described with reference to FIGS. 8 to 15 is applied to a gate or source/drain region contact structure disposed in different regions in a semiconductor device according to an exemplary embodiment will be described.

Figure 21:
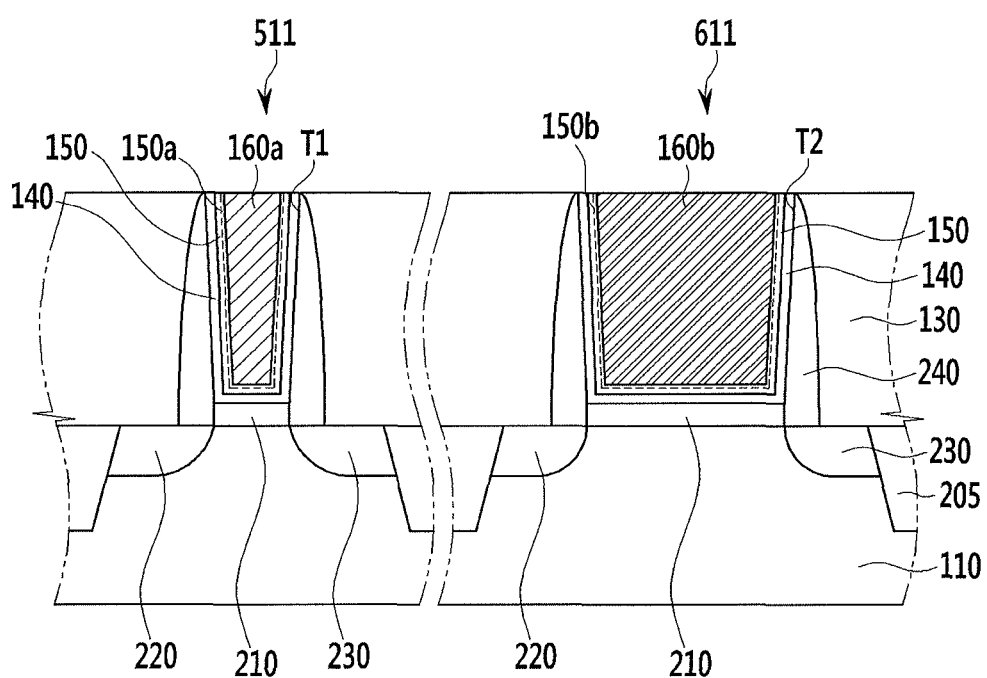
FIG. 21 illustrates a cross-sectional view schematically showing a gate structure according to an exemplary embodiment.

FIG. 21 illustrates a cross-sectional view schematically showing a gate according to an exemplary embodiment.

Referring to FIG. 21, a device isolating pattern 205 limiting an active region of a substrate 110 may be formed. The substrate 110 may be, e.g., a bulk silicon substrate, silicon (SOI) on an insulating layer, a silicon substrate, or a substrate, in which an epilayer is formed on a base substrate as described with reference to FIG. 1.

A source region 220 and a drain region 230 may be formed in the substrate 110. A gate insulating layer 210 may be disposed on the substrate 110. The gate insulating layer 210 may include a high-dielectric layer having a high dielectric constant. The gate insulating layer 210 may include at least one of a metal oxide and a metal-semiconductor-oxygen compound layer. The metal oxide may be, e.g., a hafnium oxide layer or a zirconium oxide, and the metal-semiconductor-oxygen compound layer may be, e.g., a hafnium-silicon-oxygen-nitrogen compound.

An insulating layer 130, which has a first trench T1 and a second trench T2 overlapping the gate insulating layer 210, may be disposed on the substrate 110.

A barrier layer 140 may be conformally formed in the first trench T1 and the second trench T2, and a gate spacer 240 is formed between the insulating layer 130 and the barrier layer 140. The source region 220 and the drain region 230 may be formed in an LDD structure by using the gate spacer 240.

A seed layer 150 may be disposed on the barrier layer 140. A first growth controlling region 150a and a second growth controlling region 150b may be formed in the seed layer 150.

A first metal gate electrode 160a filled in the first trench T1 may be formed on the seed layer 150, and a second metal gate electrode 160b filled in the second trench T2 may be formed on the seed layer 150. The first metal gate electrode 160a and the second metal gate electrode 160b may correspond to the first bulk layer 160a and the second bulk layer 160b descried with reference to FIG. 1, respectively.

In the present exemplary embodiment, an aspect ratio of the first trench T1, in which a gate of a first transistor 511 is formed, may be larger than an aspect ratio of the second trench T2, in which a gate of a second transistor 611 is formed. In an implementation, as described with reference to FIG. 1, an average concentration or an average thickness of the first growth controlling region 150a may be different from an average concentration or an average thickness of the second growth controlling region 150b, and all of the descriptions of the trench filled structure according to the exemplary embodiment may be applied to the present exemplary embodiment. For example, the exemplary embodiment of FIG. 21 represents an example, in which the trench filled structure is applied to the gate.

Figure 22:
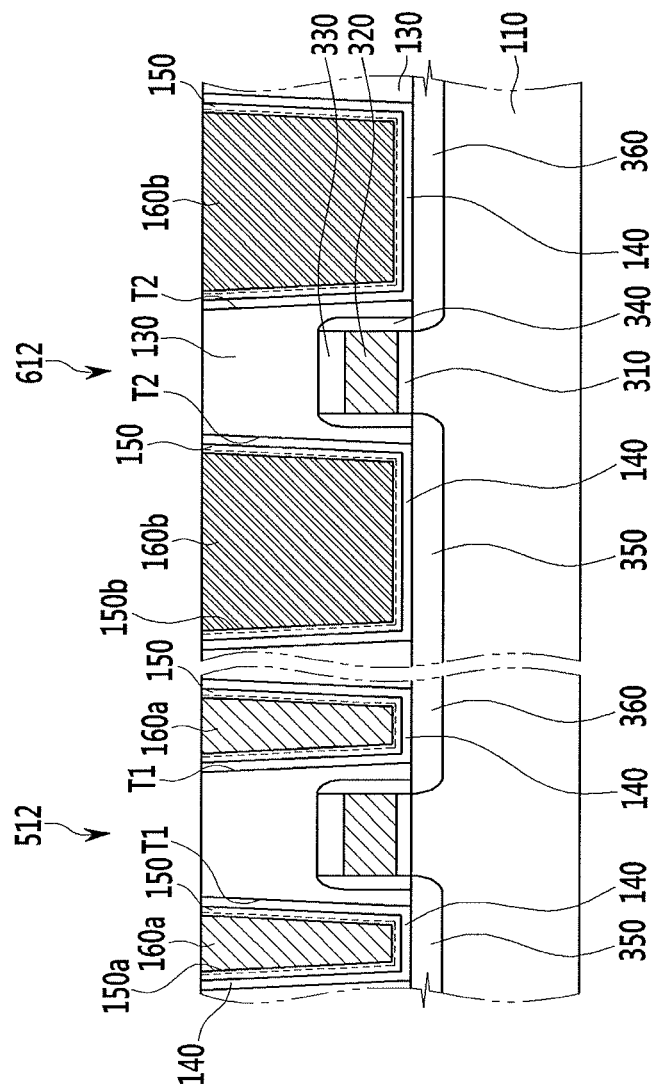
FIG. 22 illustrates a cross-sectional view schematically showing source and drain contact structures in a transistor according to an exemplary embodiment.

FIG. 22 illustrates a cross-sectional view schematically showing source and drain contact structures in a transistor according to an exemplary embodiment.

Referring to FIG. 22, a source region 350 and a drain region 360 may be formed in a substrate 110, and a gate insulating layer 310 may be disposed on an active region of the substrate 110. A gate electrode 320 may be disposed on the gate insulating layer 310, and a metal oxide silicide layer 330 may be disposed on the gate electrode 320. A spacer 340 may be disposed on a lateral surface of a gate structure including the gate insulating layer 310, the gate electrode 320, and the metal oxide silicide layer 330, and the spacer 340 may be formed by using a silicon nitride, a silicon oxynitride, or a titanium oxynitride.

An insulating layer 130 covering the gate structure may be disposed on the substrate 110. The insulating layer 130 may have a first trench T1 and a second trench T2. A barrier layer 140 may be conformally formed in the first trench T1 and the second trench T2, and a seed layer 150 may be disposed on the barrier layer 140. A first growth controlling region 150a and a second growth controlling region 150b may be formed in the seed layer 150.

A first bulk layer 160a filled in the first trench T1 may be formed on the seed layer 150, and a second bulk layer 160b filled in the second trench T2 may be formed on the seed layer 150.

In the present exemplary embodiment, an aspect ratio of the first trench T1 in a contact structure of the source region 350 and the drain region 360 of a third transistor 512 may be larger than an aspect ratio of the second trench T2 in a contact structure of the source region 350 and the drain region 360 of a fourth transistor 612. In an implementation, as described with reference to FIG. 1, an average concentration or an average thickness of the first growth controlling region 150a may be different from an average concentration or an average thickness of the second growth controlling region 150b, and all of the descriptions of the trench filled structure according to the exemplary embodiment may be applied to the present exemplary embodiment. For example, the exemplary embodiment of FIG. 22 represents an example in which the trench filled structure is applied to the contact structure of the source region and the drain region.

A semiconductor device 1000 according to a modified exemplary embodiment of the exemplary embodiment of FIGS. 20 to 22 may have a trench structure in which a plurality of transistors disposed within an SRAM formed region 500 have different aspect ratios, or a trench structure in which a plurality of transistors disposed within a logic region 600 have different aspect ratios.

By way of summation and review, according to the advanced development of the electronic industry, a semiconductor device may be highly integrated, and thus the semiconductor device may be miniaturized. Accordingly, in order to form a contact conductive layer, various issues may arise due to a lack of a process margin during a process of depositing a conductive material in a micro pattern, so that it may be gradually difficult to implement the semiconductor device. In order to satisfy the demands for the high integration of the semiconductor device, various researches have been conducted.

According to an embodiment, an aspect ratio of a contact part for an interconnection may be increased by the high integration of the semiconductor device, so that a seam and/or a void may be generated.

According to an embodiment, a plasma treatment is performed during a process of forming a bulk layer in trenches having different aspect ratios, thereby preventing a seam and/or a void from being generated in the bulk layer.

DESCRIPTION OF SYMBOLS

112: Substrate
120: Trench lower layer
130: Insulating layer
150: Seed layer
150a, 150b, 150c, 150d: Growth controlling region
160a, 160b, 160c, 160d: Bulk layer
161, 162, 163, 164: Grain
220, 350: Source region
230, 360: Drain region
511, 512, 611, 612: Transistor
T1, T2, T3, T4: Trench Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
an insulating layer on the substrate, the insulating layer including a first trench and a second trench therein, the second trench having an aspect ratio that is smaller than an aspect ratio of the first trench;
a barrier layer in the first trench and the second trench;
a seed layer on the barrier layer in the first trench and the second trench;
a first bulk layer on the seed layer and filled in the first trench; and
a second bulk layer on the seed layer and filled in the second trench,
wherein an average grain size of the second bulk layer is larger than an average grain size of the first bulk layer,
wherein the seed layer in the second trench includes a growth controlling region including a plasma material, and
wherein a concentration of the plasma material included in the growth controlling region decreases in a direction from the second bulk layer to the barrier layer in the second trench.

2. The semiconductor device as claimed in claim 1, wherein:
the insulating layer further includes a third trench therein, a third bulk layer being in the third trench and a fourth bulk layer being on the third bulk layer and filled in the third trench, and
an aspect ratio of the third trench is smaller than the aspect ratio of the first trench and is larger than the aspect ratio of the second trench.

3. The semiconductor device as claimed in claim 2, wherein an average grain size of the third bulk layer is equal to or smaller than the average grain size of the first bulk layer.

4. The semiconductor device as claimed in claim 2, wherein an average grain size of the fourth bulk layer is equal to or smaller than the average grain size of the second bulk layer.

5. The semiconductor device as claimed in claim 1, wherein:
the growth controlling region is adjacent to the second bulk layer.

6. A method of manufacturing the semiconductor device as claimed in claim 1, the method comprising:
forming the insulating layer having the first trench and the second trench on the substrate such that the second trench has the aspect ratio that is smaller than the aspect ratio of the first trench;
forming the barrier layer to cover the first trench and the second trench;
forming the seed layer in the first trench and the second trench to cover the barrier layer;

plasma-treating the seed layer such that the seed layer in the second trench includes the growth controlling region including the plasma material;
forming the first bulk layer in the first trench; and
forming the second bulk layer in the second trench,
wherein a process temperature of the forming of the second bulk layer is higher than a process temperature of the forming of the first bulk layer.

7. The method as claimed in claim 6, wherein:
forming the first bulk layer includes completely filling the first trench with the first bulk layer from a bottom of the first trench, and
forming the second bulk layer includes filling the second trench and an upper portion of the first trench while covering the first bulk layer.

8. The method as claimed in claim 6, wherein, in the plasma-treating of the seed layer, an intensity of plasma treated on the seed layer within the first trench is smaller than an intensity of plasma treated on the seed layer within the second trench.

9. The method as claimed in claim 6, wherein:
a first growth controlling region including a plasma material is formed in a portion of the seed layer on the insulating layer adjacent to an upper portion of the first trench, and
the first growth controlling region is not formed in at least one of a lower portion and a side portion of the first trench.

10. The method as claimed in claim 6, wherein plasma-treating the seed layer includes:
forming a first growth controlling region in a first seed layer in the first trench, and forming a second growth controlling region in a second seed layer in the second trench.

11. The method as claimed in claim 6, wherein, in the forming of the first bulk layer in the first trench, the first bulk layer is not formed in the second trench.

12. The method as claimed in claim 6, wherein forming the insulating layer further includes forming a third trench having an aspect ratio that is smaller than an aspect ratio of the first trench and that is larger than an aspect ratio of the second trench.

13. The method as claimed in claim 12, further comprising forming a third bulk layer in the third trench, wherein the third bulk layer is simultaneously formed with the first bulk layer.

14. The method as claimed in claim 13, further comprising filling the third trench with a fourth bulk layer after forming the third bulk layer in the third trench, wherein the fourth bulk layer is simultaneously formed with the second bulk layer.

15. A semiconductor device, comprising:
a substrate;
an insulating layer on the substrate, the insulating layer having a first trench and a second trench, the second trench having an aspect ratio that is smaller than an aspect ratio of the first trench;
a barrier layer in the first trench and the second trench;
a first seed layer in the first trench and a second seed layer in the second trench, the first seed layer and the second seed layer being on the barrier layer in the first trench and the second trench;
a first bulk layer on the first seed layer and filled in the first trench; and
a second bulk layer on the second seed layer and filled in the second trench,
wherein:
the first seed layer includes a first growth controlling region including a plasma material and the second seed layer includes a second growth controlling region including a plasma material, and
an average concentration of plasma material included in the first growth controlling region is smaller than an average concentration of plasma material included in the second growth controlling region, or an average thickness of the first growth controlling region is less than an average thickness of the second growth controlling region.

16. The semiconductor device as claimed in claim 15, wherein:
the first growth controlling region is adjacent to the first bulk layer, and
the second growth controlling region is adjacent to the second bulk layer.

17. The semiconductor device as claimed in claim 15, wherein:
a concentration of plasma material included in the first growth controlling region decreases in a direction from the first bulk layer to the barrier layer disposed in the first trench, and
a concentration of plasma material included in the second growth controlling region decreases in a direction from the second bulk layer to the barrier layer disposed in the second trench.

18. The semiconductor device as claimed in claim 15, wherein:
the insulating layer further includes a third trench therein, a third bulk layer being in the third trench and a fourth bulk layer being on the third bulk layer and filled in the third trench,
an aspect ratio of the third trench is smaller than the aspect ratio of the first trench, and
the aspect ratio of the third trench is larger than the aspect ratio of the second trench.

19. The semiconductor device as claimed in claim 18, further comprising a third seed layer in the third trench,
wherein the third seed layer includes a third growth controlling region including a plasma material, and
wherein an average concentration of plasma material included in the third growth controlling region is larger than the average concentration of plasma material included in the first growth controlling region and the average concentration of plasma material included in the third growth controlling region is smaller than the average concentration of plasma material included in the second growth controlling region, or an average thickness of the third growth controlling region is greater than the average thickness of the first growth controlling region and the average thickness of the third growth controlling region is less than the average thickness of the second growth controlling region.

20. A semiconductor device, comprising:
a substrate:
an insulating layer on the substrate, the insulating layer including a first trench, a second trench, and a third trench therein, the second trench having an aspect ratio that is smaller than an aspect ratio of the first trench;
a barrier layer in the first trench and the second trench;
a seed layer on the barrier layer in the first trench and the second trench;
a first bulk layer on the seed layer and filled in the first trench;
a second bulk layer on the seed layer and filled in the second trench;

a third bulk layer in the third trench; and
a fourth bulk layer on the third bulk layer and filled in the third trench,
wherein an average grain size of the second bulk layer is larger than an average grain size of the first bulk layer, and
wherein an aspect ratio of the third trench is smaller than the aspect ratio of the first trench and is larger than the aspect ratio of the second trench.

* * * * *